(12) United States Patent
Chou

(10) Patent No.: US 9,118,320 B2
(45) Date of Patent: Aug. 25, 2015

(54) INPUT BUFFER WITH CURRENT CONTROL MECHANISM

(71) Applicant: Elite Semiconductor Memory Technology Inc., Hsinchu (TW)

(72) Inventor: Min-Chung Chou, Hsinchu (TW)

(73) Assignee: Elite Semiconductor Memory Technology Inc., Hsinchu Science Park, Hsinchu (TW)

( * ) Notice: Subject to any disclaimer, the term of this patent is extended or adjusted under 35 U.S.C. 154(b) by 0 days.

(21) Appl. No.: 14/094,809

(22) Filed: Dec. 3, 2013

(65) Prior Publication Data

US 2015/0155873 A1    Jun. 4, 2015

(51) Int. Cl.
*H03K 3/00* (2006.01)
*H03K 19/0185* (2006.01)

(52) U.S. Cl.
CPC .............................. *H03K 19/018507* (2013.01)

(58) Field of Classification Search
None
See application file for complete search history.

(56) References Cited

U.S. PATENT DOCUMENTS

| 6,014,036 | A  | * | 1/2000  | Bozso et al. ..................... 326/21 |
| 6,359,471 | B1 | * | 3/2002  | Mueller et al. .................. 326/81 |
| 6,515,516 | B2 | * | 2/2003  | Morgan .......................... 326/86 |
| 6,717,440 | B2 | * | 4/2004  | Morgan .......................... 326/86 |
| 6,847,582 | B2 |   | 1/2005  | Pan |
| 7,095,250 | B1 | * | 8/2006  | Stolitzka et al. ................ 326/82 |
| 7,298,201 | B2 |   | 11/2007 | Ogasawara |
| 7,626,437 | B2 |   | 12/2009 | Naujokat |

* cited by examiner

*Primary Examiner* — Lincoln Donovan
*Assistant Examiner* — Khareem E Almo
(74) *Attorney, Agent, or Firm* — Winston Hsu; Scott Margo

(57) ABSTRACT

An input buffer includes a first driving circuit, a second driving circuit, a pull up circuit, and a pull down circuit. The first driving circuit is arranged for driving a first input signal to generate an output signal. The second driving circuit is arranged for driving the output signal. The pull up circuit is arranged for selectively controlling the second driving circuit to pull up the output signal according to the first input signal and a second input signal. The pull down circuit is arranged for selectively controlling the second driving circuit to pull down the output signal according to the first input signal and the second input signal.

11 Claims, 1 Drawing Sheet

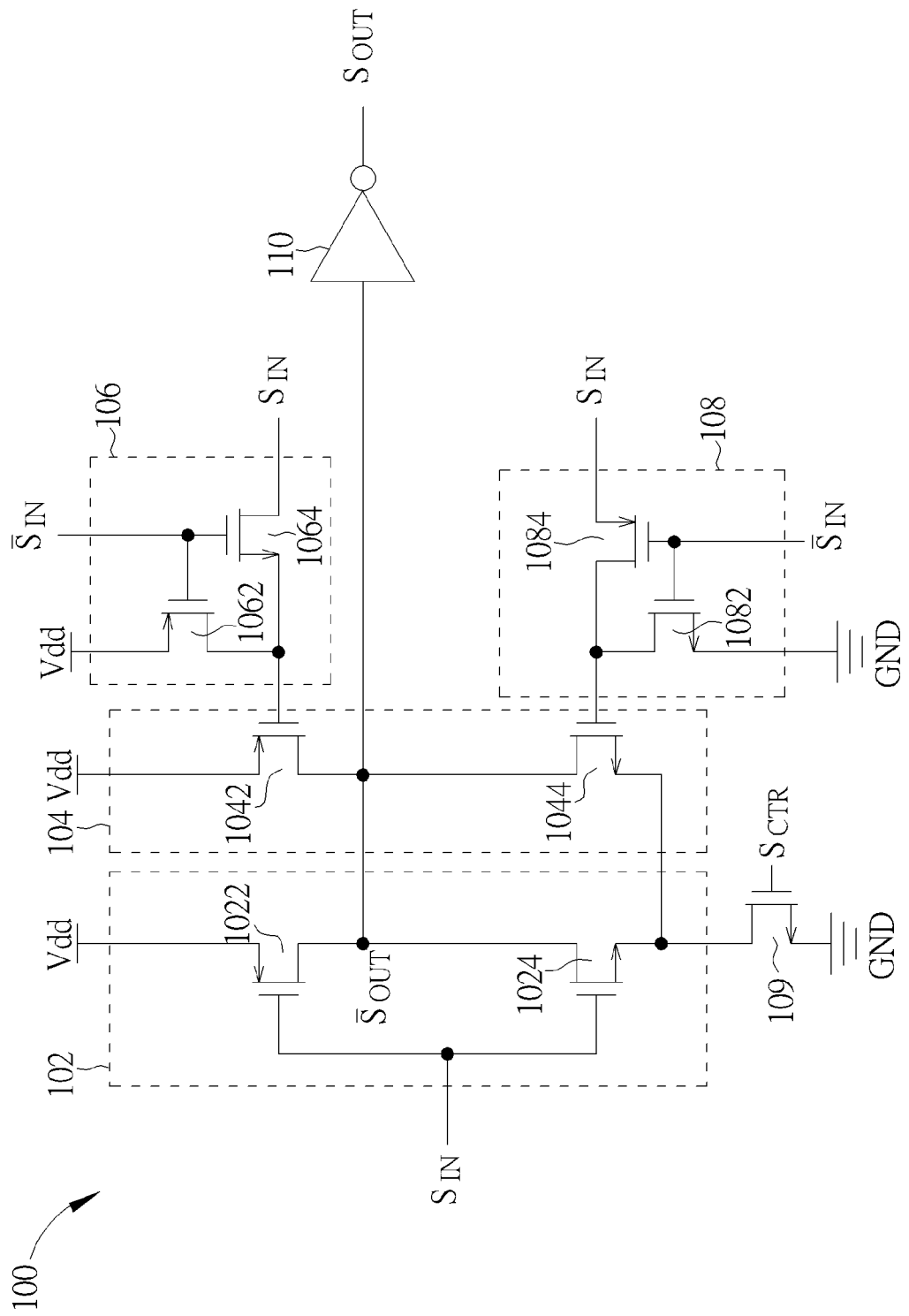

INPUT BUFFER WITH CURRENT CONTROL MECHANISM

BACKGROUND OF THE INVENTION

1. Field of the Invention

The present disclosure relates generally to an input buffer, and more specifically, to an input buffer free from cross point skews.

2. Description of the Prior Art

Input buffers are commonly used in a wide variety of digital circuits. There are also several types of input buffers. Single-ended input buffers have a single input signal applied to a buffer to actuate the buffer to transit when a first input signal transits through a predetermined voltage level. A single-ended input buffer may also compare the first input signal with a reference voltage, so that a transition occurs at the output of the input buffer when the first input signal crosses the reference voltage. There are also complementary input buffers, where a pair of complementary signals causes the output of the buffer to transit when one of the pair of complementary signals crosses the level of the other input signal.

These types of input buffers are generally adopted in digital circuits to perform a number of useful functions, such as providing a high input impedance which prevents undue loading coupled to their inputs. They can also provide conditioning signals applied to internal circuits so that internal signals may have well defined logic levels and transition characteristics. Notwithstanding the benefits provided by input buffers, they are not free from side effects. For example, input buffers may be utilized as delay cells for propagating signals in a high speed digital circuitry, but if undesirable cross point skews occur, this will induce a large current.

SUMMARY OF THE INVENTION

Therefore, one of the objectives of the present invention is to provide an input buffer free from cross point skews to solve the aforementioned problems.

According to one aspect of the present invention, an exemplary input buffer is disclosed. The exemplary input buffer comprises a first driving circuit, a second driving circuit, a pull up circuit and a pull down circuit. The first driving circuit is arranged for driving a first input signal to generate an output signal, the second driving circuit is arranged for driving the output signal, the pull up circuit is arranged for selectively controlling the second driving circuit to pull up the output signal according to the first input signal and a second input signal, and the pull down circuit is arranged for selectively controlling the second driving circuit to pull down the output signal according to the first input signal and the second input signal.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The FIGURE is a diagram illustrating an input buffer in accordance with an embodiment of the present invention.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Please refer to the FIGURE, which is a diagram illustrating an input buffer 100 in accordance with an embodiment of the present invention. The input buffer 100 includes a first driving circuit 102, a second driving circuit 104, a pull up circuit 106, a pull down circuit 108, a control transistor 109, and an inverter 110. The first driving circuit 102 is arranged for driving a first input signal $S_{IN}$ to generate an output signal $\overline{S}_{OUT}$, where the output signal $\overline{S}_{OUT}$ is an inverse of the first input signal $S_{IN}$. The first driving circuit 102 is used for driving the first input signal $S_{IN}$ to a supply voltage Vdd or a ground voltage GND according to the level of the first input signal $S_{IN}$ per se, and includes a p-channel metal oxide semiconductor (PMOS) transistor 1022 and an n-channel metal oxide semiconductor (NMOS) transistor 1024, where the PMOS transistor 1022 has its source, gate, and drain terminals respectively coupled to the supply voltage Vdd, the first input signal $S_{IN}$, and the output signal $\overline{S}_{OUT}$, and the NMOS transistor 1024 has its source, gate, and drain terminals respectively coupled to a drain terminal of the control transistor 109 (which is an NMOS transistor in this embodiment), the first input signal $S_{IN}$, and the output signal $\overline{S}_{OUT}$.

The control transistor 109 has its source and gate terminals respectively coupled to the ground voltage GND and a control signal $S_{CTR}$, where the control transistor 109 is actuate by the control signal $S_{CTR}$. The control transistor 109 plays the role of controlling activation of the first driving circuit 102 and the second driving circuit 104 of the input buffer 100. For instance, in this embodiment, once the control signal $S_{CTR}$ changes from '0' to '1', the first driving circuit 102 and the second driving circuit 104 will be actuated; once the control signal $S_{CTR}$ changes from '1' to '0', the first driving circuit 102 and the second driving circuit 104 will be inactivated. Please note the control transistor 109 set forth is for illustrative purposes only, and is not meant to be a limitation of the present invention. In other embodiments of the present invention, the control transistor 109 may be omitted without affecting the main objective disclosed in the present invention, and this also belongs to the scope of the present invention. In addition, the inverter 110 is used to invert the output signal $\overline{S}_{OUT}$, so that a non-inverting output $S_{OUT}$ can be obtained. Similarly, the use of the inverter 110 pertains to practical application, and does not affect the main objective disclosed in the present invention. Alternative designs of the inverter 110 also belong to the scope of the present invention.

The second driving circuit 104 is arranged for driving the output signal $\overline{S}_{OUT}$ to the supply voltage Vdd or the ground voltage GND according to the control of the pull up circuit 106 and the pull down circuit 108. The second driving circuit 104 includes a PMOS transistor 1042 and an NMOS transistor 1044. The PMOS transistor 1042 has its source, gate, and drain terminals respectively coupled to the supply voltage Vdd, the pull up circuit 106, and the output signal $\overline{S}_{OUT}$. The NMOS transistor 1044 has its drain, gate, and source terminals respectively coupled to the output signal $\overline{S}_{OUT}$, the pull down circuit 108, and the ground voltage GND.

The pull up circuit 106 includes a PMOS transistor 1062 and an NMOS transistor 1064. The PMOS transistor 1062 has its source, gate, and drain terminals respectively coupled to the supply voltage Vdd, a second input signal $\overline{S}_{IN}$, and the PMOS transistor 1042 in the second driving circuit 104, wherein the second input signal $\overline{S}_{IN}$ is received from outside the input buffer 100, and is derived form inversing the first input signal $S_{IN}$. However, the second input signal $\overline{S}_{IN}$ may not be exactly the inversing version of the first input signal $S_{IN}$ due to the circuit mismatch or the non-ideal characteristics. The NMOS transistor 1064 has its source, gate, and drain terminals respectively coupled to the PMOS transistor 1042 in the second driving circuit 104, the second input signal $\overline{S}_{IN}$, and the first input signal $\overline{S}_{IN}$.

The pull down circuit 108 includes an NMOS transistor 1082 and a PMOS transistor 1084. The NMOS transistor 1082 has its source, gate, and drain terminals respectively coupled to the ground voltage GND, the second input signal $\overline{S}_{IN}$, and the NMOS transistor 1044 in the second driving circuit 104. The PMOS transistor 1084 has its drain, gate, and source terminals respectively coupled to the NMOS transistor 1044 in the second driving circuit 104, the second input signal $\overline{S}_{IN}$, and the first input signal $S_{IN}$.

The main concept of the present invention is that, when the pull up circuit 106 controls the second driving circuit 104 to pull up the output signal $\overline{S}_{OUT}$, the pull down circuit 108 does not control the second driving circuit 104 to pull down the output signal $\overline{S}_{OUT}$; and when the pull down circuit 108 controls the second driving circuit 104 to pull down the output signal $\overline{S}_{OUT}$, the pull up circuit 106 does not control the second driving circuit 104 to pull up the output signal $\overline{S}_{OUT}$. In other words, the combination of the pull up circuit 106 and the pull down circuit 108 ensures that only one of the PMOS transistor 1042 and the NMOS transistor 1044 will be actuated at a time. Therefore, the large current induced by simultaneous turn-on of the PMOS transistor 1042 and the NMOS transistor 1044 is avoided.

Please note the PMOS transistors and the NMOS transistors in the embodiment are for illustrative purposes only, and are not meant to be limitations of the present invention. In other embodiments of the present invention, other types of transistors may be employed through appropriated design to achieve the same objective, and these modifications all belong to the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An input buffer, comprising:
   a first driving circuit, arranged for receiving a first input signal to generate an output signal;
   a second driving circuit, arranged for driving the output signal;
   a pull up circuit, arranged for selectively controlling the second driving circuit to pull up the output signal according to the first input signal and a second input signal; and
   a pull down circuit, arranged for selectively controlling the second driving circuit to pull down the output signal according to the first input signal and the second input signal;
   wherein the second driving circuit comprises:
      a first transistor, having a first terminal, a second terminal, and a third terminal, wherein the first terminal is coupled to a first reference voltage, the second terminal is coupled to the pull up circuit, and the third terminal is coupled to the output signal; and
      a second transistor, having a first terminal, a second terminal, and a third terminal, wherein the first terminal of the second transistor is coupled to the output signal, the second terminal of the second transistor is coupled to the pull down circuit, and the third terminal of the second transistor is coupled to a second reference voltage.

2. The input buffer of claim 1, wherein when the pull up circuit controls the second driving circuit to pull up the output signal, the pull down circuit does not control the second driving circuit to pull down the output signal; and when the pull down circuit controls the second driving circuit to pull down the output signal, the pull up circuit does not control the second driving circuit to pull up the output signal.

3. The input buffer of claim 1, wherein the first driving circuit comprises:
   a first transistor, having a first terminal, a second terminal, and a third terminal, wherein the first terminal is coupled to a first reference voltage, the second terminal is coupled to the first input signal, and the third terminal is coupled to the output signal; and
   a second transistor, having a first terminal, a second terminal, and a third terminal, wherein the first terminal of the second transistor is coupled to the output signal, the second terminal of the second transistor is coupled to the first input signal, and the third terminal of the second transistor is coupled to a second reference voltage.

4. The input buffer of claim 3, wherein the first transistor is a PMOS transistor, and the second transistor is an NMOS transistor.

5. The input buffer of claim 1, wherein the first transistor is a PMOS transistor, and the second transistor is an NMOS transistor.

6. The input buffer of claim 1, wherein the pull up circuit comprises:
   a first transistor, having a first terminal, a second terminal, and a third terminal, wherein the first terminal is coupled to a reference voltage, the second terminal is coupled to the second input signal, and the third terminal is coupled to the second driving circuit; and
   a second transistor, having a first terminal, a second terminal, and a third terminal, wherein the first terminal of the second transistor is coupled to the first input signal, the second terminal of the second transistor is coupled to the second input signal, and the third terminal of the second transistor is coupled to the third terminal of the first transistor.

7. The input buffer of claim 6, wherein the first transistor is a PMOS transistors, and the second transistor is an NMOS transistor.

8. The input buffer of claim 1, wherein the pull down circuit comprises:
   a first transistor, having a first terminal, a second terminal, and a third terminal, wherein the first terminal is coupled to a reference voltage, the second terminal is coupled to the second input signal, and the third terminal is coupled to the second driving circuit; and
   a second transistor, having a first terminal, a second terminal, and a third terminal, wherein the first terminal of the second transistor is coupled to the first input signal, the second terminal of the second transistor is coupled to the second input signal, and the third terminal of the second transistor is coupled to the third terminal of the first transistor.

9. The input buffer of claim 8, wherein the first transistor is an NMOS transistor, and the second transistor is a PMOS transistor.

10. The input buffer of claim 1, further comprising:
a control transistor, having a first terminal, a second terminal, and a third terminal, wherein the first terminal is coupled to the first driving circuit, the second terminal is coupled to a control signal, and the third terminal is coupled to a reference voltage.

11. The input buffer of claim 1, further comprising:
an inverter, having an input terminal coupled to the output signal.

* * * * *